United States Patent
Do

(10) Patent No.: US 9,882,033 B2
(45) Date of Patent: Jan. 30, 2018

(54) METHOD OF MANUFACTURING A NON-VOLATILE MEMORY CELL AND ARRAY HAVING A TRAPPING CHARGE LAYER IN A TRENCH

(71) Applicant: Silicon Storage Technology, Inc., San Jose, CA (US)

(72) Inventor: Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 15/368,451

(22) Filed: Dec. 2, 2016

(65) Prior Publication Data
US 2017/0148902 A1 May 25, 2017

Related U.S. Application Data

(62) Division of application No. 13/829,111, filed on Mar. 14, 2013, now Pat. No. 9,548,380.

(51) Int. Cl.
| | |
|---|---|
| *G11C 11/34* | (2006.01) |
| *H01L 29/792* | (2006.01) |
| *H01L 21/3205* | (2006.01) |
| *H01L 29/788* | (2006.01) |
| *H01L 29/66* | (2006.01) |
| *H01L 27/11565* | (2017.01) |
| *H01L 27/11568* | (2017.01) |
| *H01L 29/423* | (2006.01) |
| *H01L 21/02* | (2006.01) |

(52) U.S. Cl.
CPC .... *H01L 29/66833* (2013.01); *H01L 21/0217* (2013.01); *H01L 27/11565* (2013.01); *H01L 27/11568* (2013.01); *H01L 29/42344* (2013.01); *H01L 29/42352* (2013.01); *H01L 29/66825* (2013.01)

(58) Field of Classification Search
CPC ......... H01L 29/66833; H01L 29/42344; H01L 29/7926; H01L 27/11568; H01L 29/42352; H01L 27/1052; H01L 27/11565; H01L 21/0217; H01L 29/66825
USPC .................................. 257/310–330
See application file for complete search history.

(56) References Cited

U.S. PATENT DOCUMENTS

| | | |
|---|---|---|
| 6,806,531 B1 | 10/2004 | Chen et al. |
| 6,913,975 B2 | 7/2005 | Chen et al. |
| 6,940,125 B2 | 9/2005 | Kianian et al. |

(Continued)

*Primary Examiner* — Marcos D Pizarro
*Assistant Examiner* — Nelson Garces
(74) *Attorney, Agent, or Firm* — DLA Piper LLP (US)

(57) ABSTRACT

A memory cell formed by forming a trench in the surface of a substrate. First and second spaced apart regions are formed in the substrate with a channel region therebetween. The first region is formed under the trench. The channel region includes a first portion that extends along a sidewall of the trench and a second portion that extends along the surface of the substrate. A charge trapping layer in the trench is adjacent to and insulated from the first portion of the channel region for controlling the conduction of the channel region first portion. An electrically conductive gate in the trench is adjacent to and insulated from the charge trapping layer and from the first region and is capacitively coupled to the charge trapping layer. An electrically conductive control gate is disposed over and insulated from the second portion of the channel region for controlling its conduction.

6 Claims, 5 Drawing Sheets

(56) References Cited

U.S. PATENT DOCUMENTS

| | | |
|---|---|---|
| 7,015,537 B2 | 3/2006 | Lee et al. |
| 7,238,599 B2 * | 7/2007 | Forbes ................ G11C 11/5692 257/E21.21 |
| 7,247,907 B2 * | 7/2007 | Gao ................... G11C 16/0483 257/315 |
| 7,668,013 B2 | 2/2010 | Chern et al. |
| 7,974,136 B2 | 7/2011 | Chern et al. |
| 8,148,768 B2 | 4/2012 | Do et al. |
| 2003/0075756 A1 * | 4/2003 | Suzuki .............. H01L 21/28273 257/315 |
| 2004/0000688 A1 * | 1/2004 | Harari ................... H01L 27/115 257/315 |
| 2006/0180849 A1 | 8/2006 | Yuda |
| 2007/0018234 A1 | 1/2007 | Chindalore |
| 2008/0080249 A1 * | 4/2008 | Chen ................ H01L 27/11568 365/185.18 |
| 2009/0289294 A1 * | 11/2009 | Izumi ................ H01L 27/11519 257/316 |
| 2011/0175156 A1 | 7/2011 | Okuyama |

* cited by examiner

METHOD OF MANUFACTURING A NON-VOLATILE MEMORY CELL AND ARRAY HAVING A TRAPPING CHARGE LAYER IN A TRENCH

RELATED APPLICATIONS

This application is a divisional of U.S. application Ser. No. 13/829,111, filed Mar. 14, 2013.

TECHNICAL FIELD

The present invention relates to a non-volatile memory cell, having a trapping charge layer, and an array and a method of manufacturing the cell and the array in a trench.

BACKGROUND OF THE INVENTION

Non-volatile memory cells having a trapping charge layer in a trench is well known in the art. See for example, U.S. Pat. No. 6,940,125, whose disclosure is incorporated herein by its entirety. Split gate floating gate non-volatile memory cells in a trench are also well known in the art. See for example US publication 2010/0127308. However, heretofore, the size of a split gate non-volatile memory cell using a trapping charge layer for storage of charges remains too large.

SUMMARY OF THE INVENTION

Accordingly, in the present invention the size of a split gate non-volatile memory cell using a charge trapping layer as the storage element is decreased. In particular, the present non-volatile memory cell comprises a substrate material having a first conductivity type and a surface. A trench is formed in the surface of the substrate. First and second spaced apart regions are formed in the substrate with each having a second conductivity type, with a channel region in the substrate therebetween. The first region is formed under the trench, and the channel region includes a first portion that extends substantially along a sidewall of the trench and a second portion that extends substantially along the surface of the substrate. A charge trapping layer is in the trench adjacent to and insulated from the first portion of the channel region for controlling the conduction of the first portion of the channel region. An electrically conductive gate is in the trench, adjacent to and insulated from the charge trapping layer and from the first region and is capacitively coupled to the charge trapping layer. An electrically conductive control gate is disposed over and insulated from the second portion of the channel region for controlling the conduction of the second portion of the channel region.

The present invention also relates to an array of the foregoing described non-volatile memory cells and a method of manufacturing the cell and the array of cells.

DETAILED DESCRIPTION OF THE PREFERRED EMBODIMENT

Figure 1:
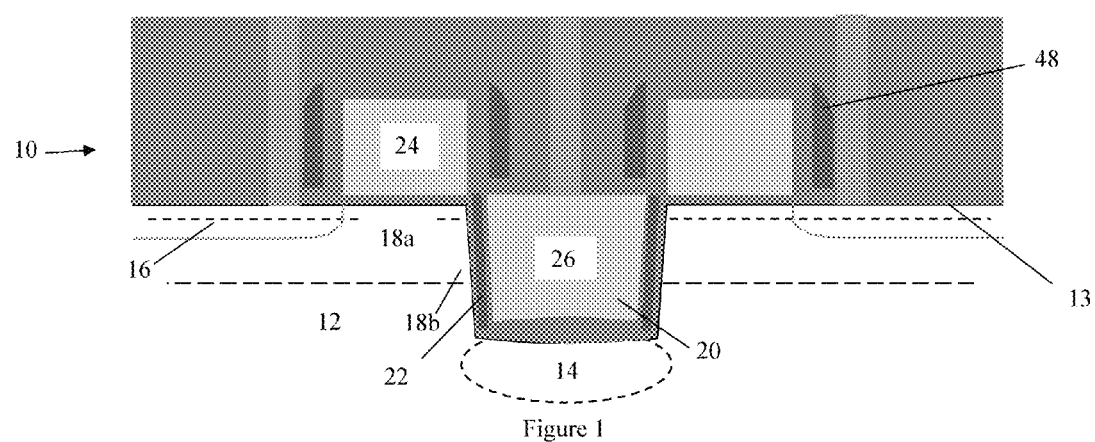
FIG. 1 is a cross-sectional view of a non-volatile memory cell of the present invention.

Referring to FIG. 1 there is shown a cross-sectional view of a memory cell 10 of the present invention. The memory cell 10 comprises a semiconductor substrate 12 of a first conductivity type, such as P type. The substrate 12 has a surface 13. A trench 20 is cut into the surface 13. A first region 14 of a second conductivity type, such as N, is in the substrate 12 at the bottom of the trench 14. A second region 16 also of the second conductivity type N, spaced apart from the first region 14 is along the surface 13. Between the first region 14 and the second region 16 is a channel region 18. The channel region 18 has two portions: a first portion 18a and a second portion 18b. The first portion 18a is along the surface 13, with the second portion 18b along a sidewall of the trench 20. A trapping charge layer 22 is in the trench, spaced apart from the second portion 18b of the channel region 18. The trapping charge layer 22 is an insulating film, such as Silicon Nitride (SiN). A coupling gate 26 is also in the trench 20. The coupling gate 26 is insulated from the trapping charge layer 22 and is adjacent thereto, and in the preferred embodiment does not extend above the surface 13 of the substrate 12. The coupling gate 26 is also insulated from the first region 14. A word line gate 24 is above the first portion 18a of the channel region and is insulated therefrom.

Figure 3:
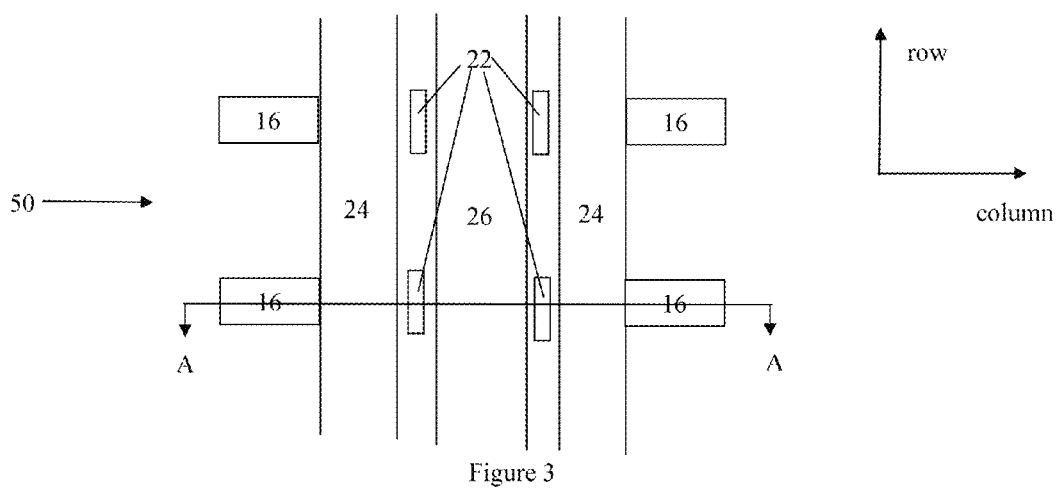
FIG. 3 is a top view of an array of the memory cells of the present invention.

Referring to FIG. 3 there is shown a top view of an array 50 of the memory cells 10 of the present invention in the substrate 12. FIG. 3 shows the direction of row lines and column lines. As is well known in the art, the term row and the term column may be interchanged. The trenches 20 are shown extending in the row direction, as are also the coupling gate 26 and the word line gate 24. In addition the first regions 14 also extend in the row line direction. The second regions 16 in the same column line direction are electrically connected by a bit line in the column direction. Finally, the trapping charge layers 22 within each column are isolated from the other trapping charge layers 22 in the same column, and are also isolated from other trapping charge layers 22 in the same row direction.

The operation of the memory cell 10 may be as follows:

| | Bit line or Second Region 16 | Word Line Gate 24 | Coupling Gate 26 | Source Line or First Region 14 |
|---|---|---|---|---|
| Read | ~0.6 V | Vcc | Vcc | 0 V |
| Program | ~1 uA | ~1 V | ~10 V | ~5 V |
| Erase | 0 V | 0 V | ~-7 V | ~7 V |

During programming, the 1V on the word line gate 24 turns on the first portion of the channel region 18a. Electrons from the second region 16 are attracted by the high voltage potential (5 V) at the first region 14. As they near the trench 20, the high voltage from the coupling gate 26 causes them to be abruptly injected onto the trapping charge layer 22. Thus, programming is accomplished by the mechanism of source side hot electron injection.

During erase, hot holes are injected from the channel region 18 onto the trapping charge layer 22. A high voltage (e.g. ~7V) on the source generates electron/hole pairs. With a negative voltage on the coupling gate (e.g. ~-7V), some holes will be attracted to the nitride layer.

Finally during read operation, if the trapping charge 22 is programmed with electrons, then the voltage of Vcc on the coupling gate 26 is unable to turn on (or turns on weakly) the second portion 18b of the channel region 18. However, if the trapping charge 22 is erased, then the voltage of Vcc is able to turn on more strongly the second portion 18b of the channel region 18. The difference between the two states may be detected by the amount of current flowing in the channel region 18.

With respect to the operation of an array 50 of memory cells 10 of the present invention, the operating conditions may be as follows:

|  | Bit line or Second Region 16 | | Word Line Gate 24 | | Coupling Gate 26 | | Source Line or First Region 14 | |
| --- | --- | --- | --- | --- | --- | --- | --- | --- |
|  | Selected | UNSel | Selected | UNSel | Selected | UNSel | Selected | UNSel |
| Read | ~0.6 V | 0 V | Vcc | 0 V | Vcc | Vcc/0 V | 0 V | 0 V |
| Program | ~1 uA | Vcc | ~1 V | 0 V | ~10 V | Vcc/0 V | ~5 V | 0 V |
| Erase | 0 V | 0 V | 0 V | 0 V | ~-7 V | 0 V | ~7 V | 0 V |

Figure 2A:
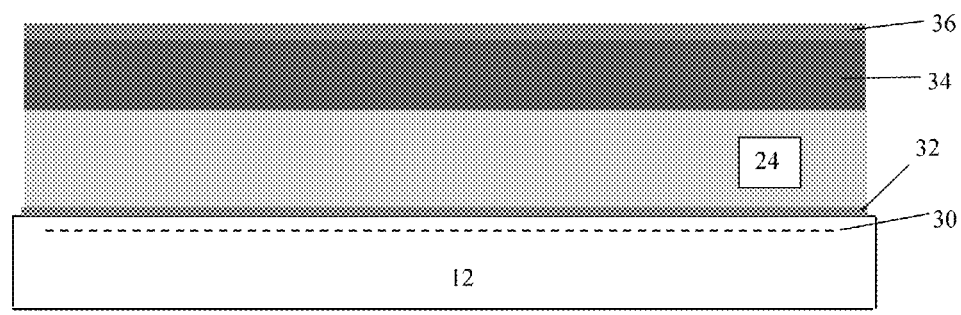
FIGS. 2A-2I are cross-sectional views taken in a column direction through the active region, of the process steps in the manufacturing of the memory cell, and an array of the memory cells of the present invention.

Referring to FIG. 2A there is shown a cross-sectional view taken through the lines A-A in FIG. 3 of the first step in the process of making the cell 10 of the present invention and the array 50 of cells 10 of the present invention. The line A-A is taken through the active region of the substrate 12.

Initially, an implant 30 is made into the substrate 12 to define the transistor under the word line gate 24. The implant may be p-type. Thereafter a layer 32 of silicon dioxide is formed on the surface 13 of the substrate 12. The layer 32 of silicon dioxide may be formed by thermal oxidation to a thickness of approximately 10 Å to 80 Å. A layer 24 of polysilicon is then formed on the layer 32 of silicon dioxide. The polysilicon layer 24 is on the order of 500 Å to 2000 Å in thickness and may be formed by a CVD method. A layer of silicon nitride 34 on the order of 500 Å to 1000 Å in thickness is then formed on the polysilicon layer 24. The silicon nitride layer 34 can be formed by CVD. Finally, another layer 36 of silicon dioxide on the order of 100 Å to 500 Å in thickness is formed on the silicon nitride layer 34. The layer 36 of silicon dioxide can be formed by CVD. The resultant structure is shown in FIG. 2A.

Figure 2B:
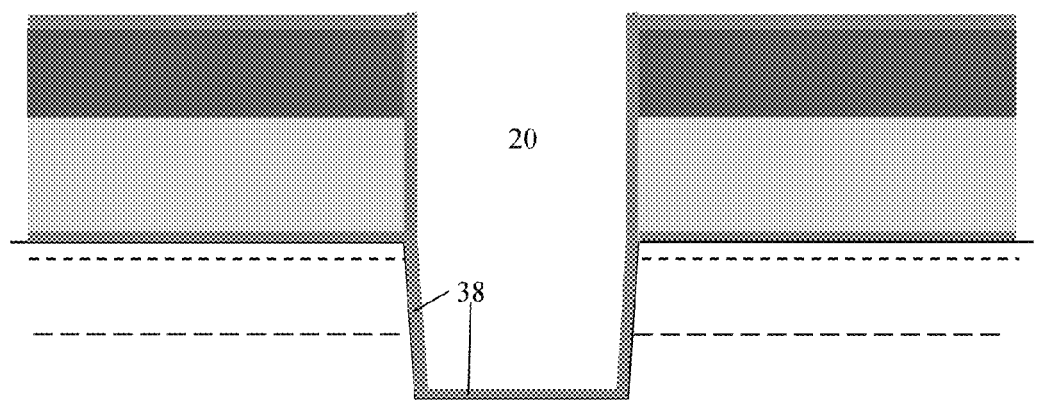

A mask is formed on the silicon dioxide layer 36 and is patterned. A plurality of spaced apart mask openings are formed on the mask in the row direction. Through the mask openings, a plurality of spaced apart trenches 20 are formed. The trenches 20 cut through the silicon dioxide 36, the silicon nitride 34, the polysilicon 24 the silicon dioxide 32 and through the substrate 12, to a depth of approximately between 500 Å to 1500 Å. A layer 38 of silicon dioxide is then deposited, which lines the sidewalls and bottom of the trenches 20. The silicon dioxide 38 deposited is on the order of 50 Å to 150 Å in thickness. The resultant structure is shown in FIG. 2B.

The layer of silicon dioxide 38 in the trench 20 as well as the silicon dioxide 36 above the silicon nitride 34 is removed. This can be done by anisotropic etching. The silicon dioxide serves to passivate the trench surface. The resultant structure is shown in FIG. 2C.

Figure 2C:
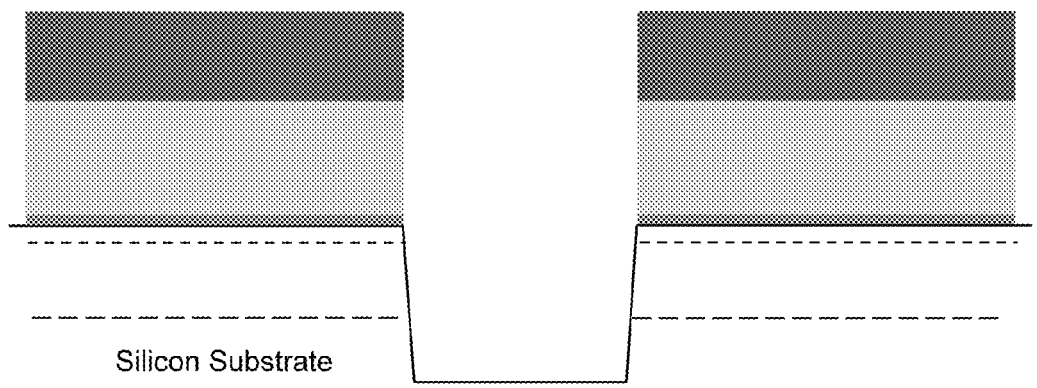
Figure 2D:
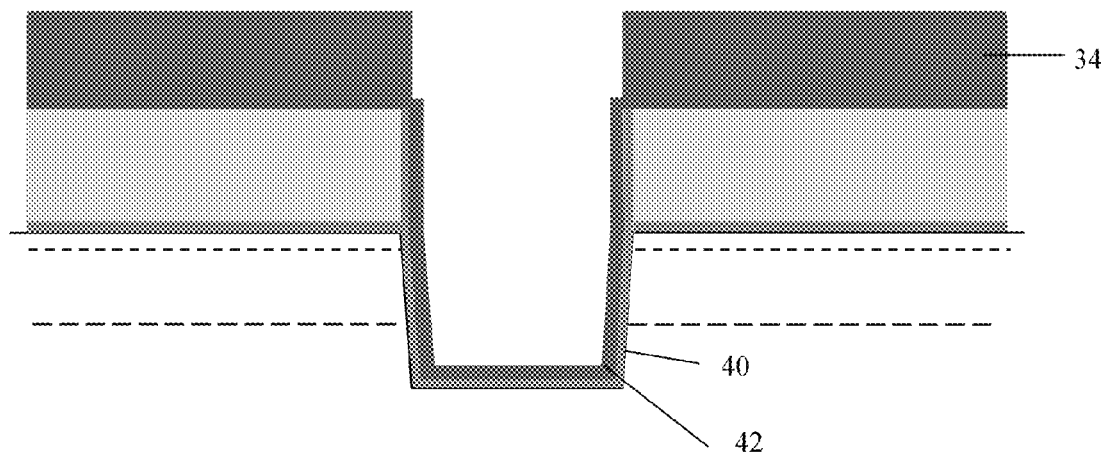

The structure shown in FIG. 2C is then subject to a high temperature oxidation process, which causes the exposed polysilicon layer 24 and the silicon substrate 12 in the trench 20 to be converted into silicon dioxide 40. This results in a layer of silicon dioxide 40 of approximately 50 Å to 100 Å in thickness in the trench 20 along the entire row direction. A layer 42 of 30 Å to 150 Å thickness of silicon nitride is then deposited everywhere including over the layer 40 of silicon dioxide. The resultant structure is shown in FIG. 2D.

A masking step is performed in which openings are made in the mask in the column direction in columns adjacent to the active regions shown in FIGS. 2(A-I). Through the openings in the mask, the nitride layer 42 and the oxide layer 40 are anisotropically etched, resulting in discontinuity of the silicon nitride layer 42 across the length of the trench 20. The mask is then removed. Source implant is made, which forms a continuous N type region along the bottom of the trench forming the first region 14. A further anisotropical etch of silicon nitride 42 is performed. This removes the silicon nitride 42 from the bottom of the trench 20 in the active areas, which was covered by the mask. A thick layer 41 of source oxide is then grown by oxidizing the structure, to a thickness of approximately 100 Å to 300 Å. The resultant structure is shown in FIG. 2E.

Figure 2E:
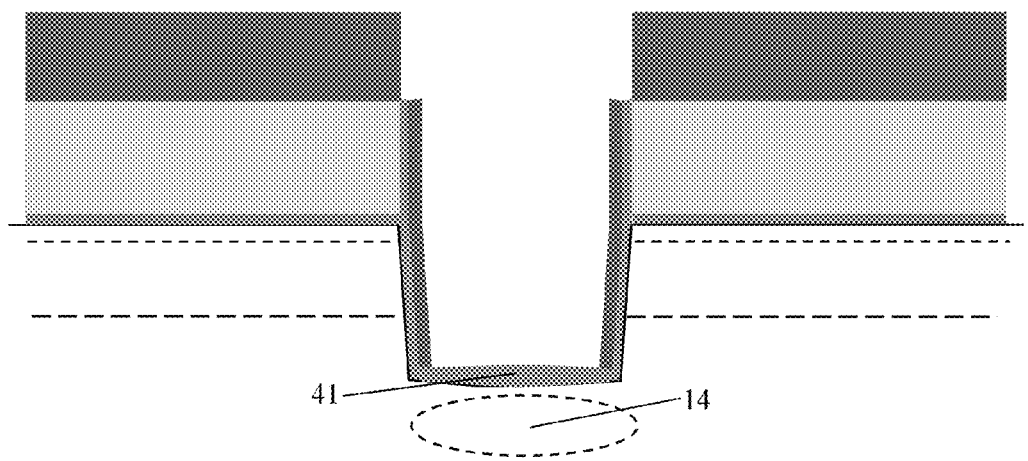

A thin layer of silicon dioxide 44 is then deposited on the structure shown in FIG. 2E. The layer 44 of silicon dioxide is on the order of 20 Å to 150 Å. Thereafter, a relatively thick layer of polysilicon 26 is deposited on the structure. The layer of polysilicon 26 is deposited to a thickness of on the order of 500 Å to 2000 Å, such that it fills the trench 20 and fills above the structure shown in FIG. 2E. The resultant structure is shown in FIG. 2F.

Figure 2F:
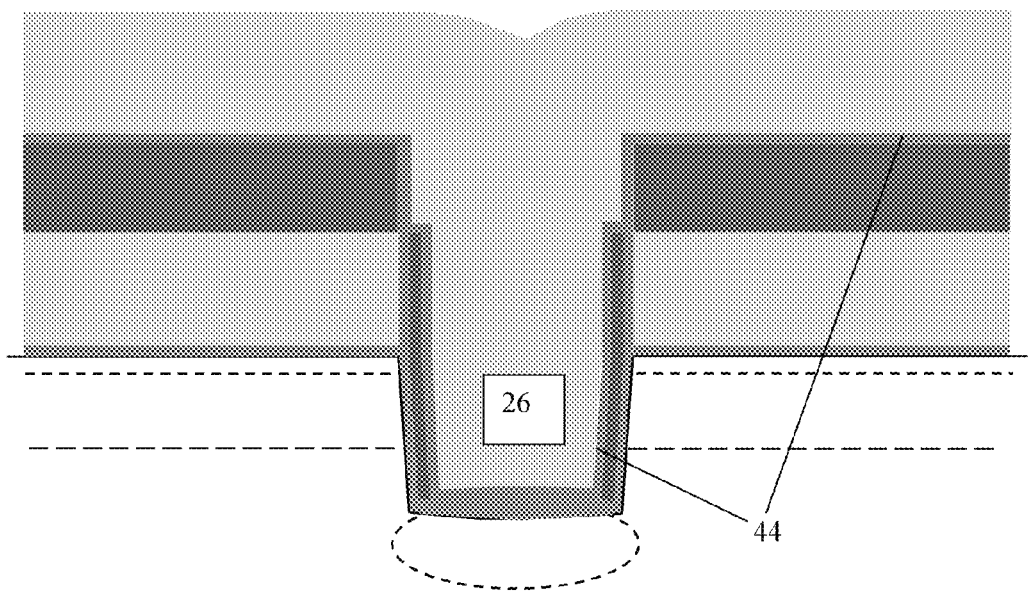
Figure 2G:
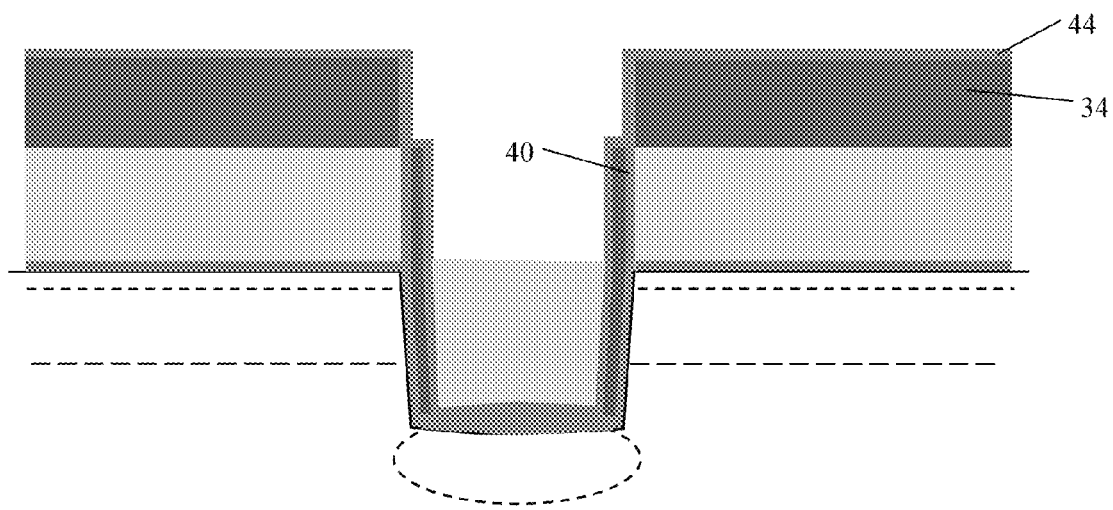

The structure shown FIG. 2F is then subject to a Chemical Mechanical Polishing (CMP) of the polysilicon 26 to the level of the silicon dioxide 44. After CMP of the polysilicon 26, the polysilicon 26 is then further anisotropically etched until it approximately fills the trench to the level of the surface 13. The resultant structure is shown in FIG. 2G The structure shown in FIG. 2G is then subject to an anisotropic etch to remove the silicon dioxide 44, the silicon nitride 34 and the silicon dioxide 40. The resultant structure is shown in FIG. 2H.

Figure 2H:
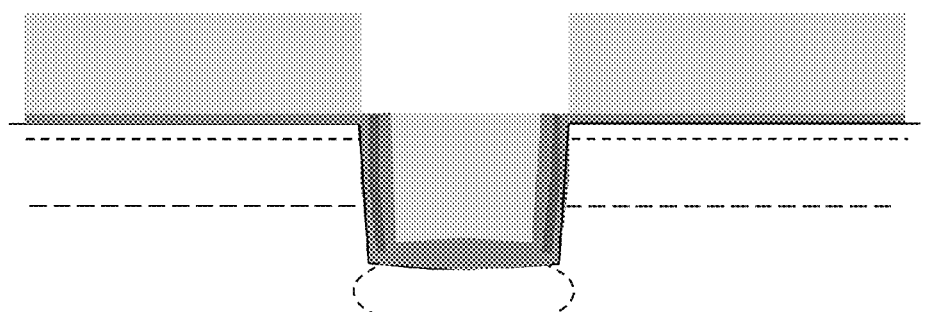

The structure shown in FIG. 2H is subject to a masking step in which openings are made in the mask in the row direction. The polysilicon 24 through the openings is then anisotropically etched. A silicon dioxide layer 46 of approximately 50 Å to 200 Å in thickness is deposited on the structure, followed by a deposition of silicon nitride 48 of approximately 50 Å to 200 Å in thickness over the silicon dioxide 46. The resultant structure is shown in FIG. 2I.

Figure 2I:
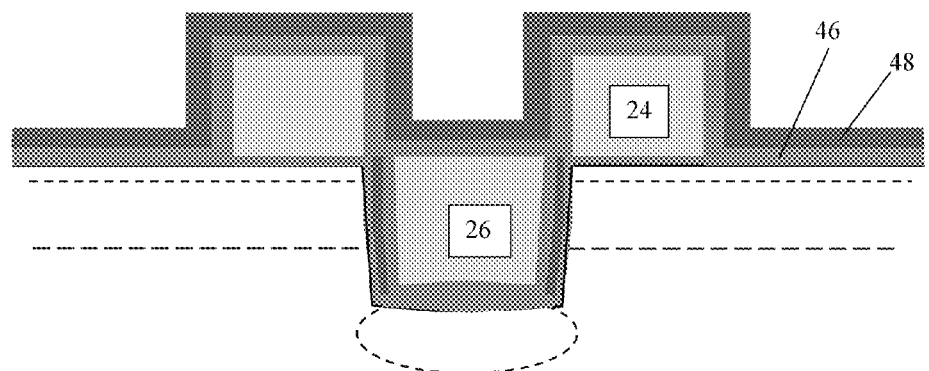

The structure shown in FIG. 2I is then subject to an anistotroipcal etch of the silicon nitride 48 forming spacers 48. N+ ion implant is made forming the second regions 16. The structure is finished by depositing a protective insulation (e.g. oxide), salicidation, ILD and CMP etch, followed by contact formation by a lithographic process to form contact holes down to second regions 16 and polysilicon 26 and then filling those holes with conductive material (deposition and CMP etch back). The resulting structure is shown in FIG. 1.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the non-volatile memory cell of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming a non-volatile memory cell, comprising:
    forming a trench into a surface of a semiconductor substrate, wherein the substrate has a first conductivity type;
    forming first and second spaced apart regions of a second conductivity type in the substrate with the first region formed under the trench with a channel region between the first region and the second region, wherein a first portion of the channel region is along a sidewall of the trench and a second portion of the channel region is along the surface of the substrate;
    forming a charge trapping layer in said trench adjacent to and insulated from the first portion of the channel region, for controlling the conduction of the first portion of the channel region;
    forming a coupling gate in the trench adjacent to and insulated from the charge trapping layer, and insulated from the first region; and
    forming a control gate insulated from the second portion of the channel region only by a single insulation layer, without any conductive gate disposed between the control gate and the second portion of the channel region;
    wherein said charge trapping layer is in the trench and extends no higher than the single insulation layer, and wherein said conductive gate is in said trench and extends no higher than the single insulation layer.

2. The method of claim 1 wherein said charge trapping layer is silicon nitride.

3. The method of claim 1 wherein said control gate is only above the surface.

4. A method of forming an array of non-volatile memory cells in a substrate material having a first conductivity type and a surface; said method comprising:
    forming a plurality of spaced apart trenches, substantially parallel to one another extending in a row direction, in the surface of the substrate;
    forming a plurality of first regions, with each first region formed under each trench extending in the row direction with each first region being of a second conductivity type;
    forming a plurality of second regions along the surface of the substrate between trenches, in a column direction substantially perpendicular to the row direction, with a channel region for each memory cell between each second region and an adjacent first region; said channel region includes a first portion that extends substantially along a sidewall of the trench and a second portion that extends substantially along the surface of the substrate, adjacent to the second region;
    forming a pair of charge trapping layers in the trench in each column, each charge trapping layer adjacent to and insulated from the sidewalls of the trench along the first portion of the channel region for controlling the conduction of the first portion of the channel region;
    forming a plurality of electrically conductive gates, with a conductive gate in each trench extending in the row direction, adjacent to and insulated from the charge trapping layers of each column and from the first region and capacitively coupled to the charge trapping layers; and
    forming a plurality of spaced apart electrically conductive control gates, parallel to one another, extending in the row direction, disposed over and insulated from the second portion of each channel region only by a single insulation layer, without any conductive gate disposed between the control gates and the second portion of each channel region, for controlling the conduction of each second portion of the channel region;
    wherein said charge trapping layer is in the trench and extends no higher than the single insulation layer, and wherein said conductive gate is in said trench and extends no higher than the single insulation layer.

5. The method of claim 4 wherein said charge trapping layer is silicon nitride.

6. The method of claim 4 wherein said control gate is only above the surface.

* * * * *